United States Patent
Marty et al.

(10) Patent No.: US 7,395,399 B2
(45) Date of Patent: Jul. 1, 2008

(54) CONTROL CIRCUIT TO ENABLE HIGH DATA RATE ACCESS TO A DRAM WITH A PLURALITY OF AREAS

(75) Inventors: Pierre Marty, Seyssins (FR); Gaelle Rey, Grenoble (FR); Pascal Chauvet, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/446,553

(22) Filed: Jun. 2, 2006
(Under 37 CFR 1.47)

(65) Prior Publication Data
US 2007/0094460 A1    Apr. 26, 2007

Related U.S. Application Data

(63) Continuation of application No. 10/700,361, filed on Nov. 3, 2003, now abandoned, which is a continuation of application No. 10/406,627, filed on Apr. 3, 2003, now abandoned, which is a continuation of application No. 10/111,506, filed on Apr. 23, 2002, now abandoned.

(51) Int. Cl.
*G06F 12/00* (2006.01)
(52) U.S. Cl. ........................ 711/169; 711/153
(58) Field of Classification Search ............. 711/153, 711/169
See application file for complete search history.

(56) References Cited

U.S. PATENT DOCUMENTS

| | | | |
|---|---|---|---|
| 5,287,466 A * | 2/1994 | Kodama | 712/206 |
| 5,822,772 A | 10/1998 | Chan et al. | |
| 5,903,509 A * | 5/1999 | Ryan et al. | 365/230.03 |
| 6,195,724 B1 | 2/2001 | Stracovsky et al. | |
| 6,212,611 B1 * | 4/2001 | Nizar et al. | 711/169 |
| 6,216,178 B1 | 4/2001 | Stracovsky et al. | |
| 6,286,075 B1 | 9/2001 | Stracovsky et al. | |
| 6,389,520 B2 * | 5/2002 | Christenson | 711/157 |
| 6,392,935 B1 * | 5/2002 | Mulholland | 365/189.05 |
| 6,470,433 B1 * | 10/2002 | Prouty et al. | 711/168 |
| 2001/0037444 A1 * | 11/2001 | Munson et al. | 712/207 |

OTHER PUBLICATIONS

Burd, "Systems Architecture", © 1998 Course Technology, 2nd edition, p. 166, 169, 204.*

* cited by examiner

*Primary Examiner*—Brian P. Peugh
(74) *Attorney, Agent, or Firm*—Lisa K. Jorgenson; James H. Morris; Wolf, Greenfield & Sacks, P.C.

(57) ABSTRACT

A circuit for controlling a memory including at least two areas to which access cannot be had simultaneously, the circuit including first circuitry for storing a series of read and/or write instructions separately for each of the areas, and second circuitry for detecting that a first instruction intended for a first area is a predetermined instruction to be followed by a period during which the first area can receive no other instruction, and third circuitry for, during the period, providing instructions to another memory area.

19 Claims, 3 Drawing Sheets

CONTROL CIRCUIT TO ENABLE HIGH DATA RATE ACCESS TO A DRAM WITH A PLURALITY OF AREAS

CROSS REFERENCE TO RELATED APPLICATIONS

This application is a continuation of U.S. application Ser. No. 10/700,361 filed Nov. 2, 2003, which in turn is a continuation of U.S. application Ser. No. 10/406,627 filed on Apr. 3, 2003, which in turn is a continuation of U.S. application Ser. No. 10/111,506, filed on Apr. 23, 2002, entitled "Dram Control Circuit," which are incorporated herein by reference in their entirety.

BACKGROUND OF THE INVENTION

1. Field of the Invention

The present invention relates to a memory control circuit, and in particular to a circuit for controlling an external memory of SDRAM, DDR, or RAMBUS type including several memory areas.

2. Discussion of the Related Art

Many electronic systems must store a large amount of data in a memory and they must have fast access to these data. Memories of dynamic RAM or DRAM type, generally including several memory areas each accessible via a cache with a high data rate, are fit for this type of use. Such memories generally are discrete integrated circuits (external memories) which must be connected to memory control circuits for connection to the rest of the electronic system.

FIG. 1 schematically shows a memory control circuit 2 connected to a DRAM-type memory 4 via a control bus COM and a data bus DAT. Memory 4 includes two memory areas A and B, each of which is connected to data bus DAT via a cache, respectively BUFA and BUFB. Memory 4 is rated by a clock signal CK. Memory areas A and B are both organized in several memory pages (not shown), each of which includes a predetermined number of words. Caches BUFA and BUFB are connected by control bus COM to circuit 2. Circuit 2 includes a priority management block 8 connected to receive read and/or write requests from blocks (not shown), which are further connected to bus DAT to exchange data with memory 4. Block 8 receives write and/or read requests intended for one or the other of the memory areas. When block 8 simultaneously receives two requests provided by two blocks, it gives priority for processing to the request received from that of the two blocks holding the priority over the other. The priority order of the blocks is generally programmed upon circuit initialization. Circuit 2 further includes a block 10, connected between the output of block 8 and bus COM, which converts the requests received by block 8 from a communication protocol specific to circuit 2 to a communication protocol specific to memory 4. The protocol accepted by a memory depends on the type and on the builder of the memory.

FIG. 2 schematically illustrates two series of instructions provided by block 10 at the rate of clock signal CK. In the example shown, block 10 receives a first request for writing a word, intended for an address A1' in a page A1 of memory area A, then a second request for writing a word, intended for an address B1' in a page B1 of memory area B. In the example shown, such write requests each start with the rewriting of the data of the considered cache into a previously processed page (preload of the cache, instruction PRE), followed by the writing of the considered page into said cache (cache activation, instruction ACT), followed by the writing of the considered word into said cache (instruction WR).

At a time t0 corresponding to the beginning of the first write request, block 10 provides bus COM with an instruction PRE A0 for preloading cache BUFA. It should be noted that the preload instruction is provided to cache BUFA in a period T of clock signal CK, but that a preload operation cannot be executed in one period only. The preload execution speed is a characteristic of memory 4. In the example shown, memory 4 executes the preload operation in three periods. Thus, during two periods following the reception of the preload instruction, the cache cannot receive other instructions and block 10 must provide two non-instructions "NOP" between the preload instruction and the next activation instruction. At a time t1 occurring three periods T after time t0, block 10 provides bus COM with a page activation control signal ACT A1 requiring from cache BUFA to read the page of address A1 in memory area A. The activation instruction is provided to cache BUFA in one period T but the activation operation is executed in three periods, and block 10 needs to provide two instructions NOP between the activation instruction and the next write instruction. At a time t2, occurring three periods T after time t1, block 10 provides an instruction WR A1' for writing the word having address A1' into cache BUFA. It should be noted that the word to be written at address A1' is provided to data bus DAT when instruction WR A1 is provided. A single period is necessary to execute the write operation. At a time t3 located one period T after time t2, the operation of writing the word of address A1' of page A1 into memory area A is over.

The second write request progresses in the same way as the first write request. At time t3, block 10 provides an instruction PRE B0 for preloading cache BUFB. At a time t4 occurring three periods T after time t3, block 10 provides an instruction ACT B1 for activating the page of address B1 in memory area B. Finally, at a time t5 occurring three periods T after time t4, block 10 provides an instruction WR B1' for writing the word of address B1' of page B1.

It should be noted that when a first and a second write requests must be successively executed in a same page, the used cache already contains the right page after the first writing and it is not necessary to execute the second write request for block 10 to provide once again the instructions of preload and activation of said page. It should also be noted that some memories are provided to automatically have any writing into a word of a cache followed by a sequence of write operations into the following word of the cache. Such a writing sequence is called writing in burst mode. In a burst writing, the used cache cannot receive any other instruction and block 10 provides instructions NOP. A burst writing is conventionally interrupted by a predetermined instruction such as the preload instruction.

The execution of a request for reading a word from a page of the memory area is similar to the previously-described execution of a word write request, a word read instruction (RD) replacing the word write instruction (WR).

Recent technological progress has enabled developing DRAMs operating at very high frequencies ranging up to 800 MHz. It has up to now been possible to develop control circuits able to provide the control instructions of such memories, using particularly simple and fast architectures. However, the rate of data exchanged with the memory is desired to be further increased. It is possible to increase the speed of access to memories, but the development of control circuits operating with faster clock signals poses many problems, especially those of a high development cost and a high power consumption. The use of very wide control and data buses also enables increasing the data rate, but such a solution requires using several memories, each of which is connected to a portion of the bus, and the use of several memories is expensive.

SUMMARY OF THE INVENTION

An object of the present invention is to provide a control circuit enabling access with a high data rate to a memory of DRAM type including at least two areas.

Another object of the present invention is to provide such a control circuit using control and data buses having a standard width.

Another object of the present invention is to provide such a circuit operating with a clock signal of low frequency.

Another object of the present invention is to provide such a circuit that can operate with an inexpensive memory having a low maximum operating frequency.

To achieve these objects, as well as others, the present invention provides a circuit for controlling a memory including at least two areas to which access cannot be had simultaneously, the circuit including first means for storing a series of read and/or write instructions separately for each of said areas, and second means for detecting that a first instruction intended for a first area is a predetermined instruction to be followed by a period during which the first area can receive no other instruction, and third means for, during said period, providing instructions to another memory area.

According to an embodiment of the present invention, each of the memory areas is accessible via a specific cache.

According to an embodiment of the present invention, the circuit further includes fourth means for receiving read and/or write requests and for writing each of them in the form of a series of instructions into the first means, each series of instructions including a predetermined number of data.

According to an embodiment of the present invention, said predetermined number of data of a series of instructions includes an indication of the priority order existing between each series of instructions stored in the first means.

According to an embodiment of the present invention, said predetermined number of data of a series of instructions includes an indication of whether the series of instructions aims at a reading from or at a writing into the memory.

According to an embodiment of the present invention, said predetermined number of data of a series of instructions includes the addresses for which said series of instructions is intended.

According to an embodiment of the present invention, said predetermined number of data of a series of instructions includes the instructions forming said series of instructions.

According to an embodiment of the present invention, said predetermined number of data of a series of instructions includes the duration necessary to execute said series of instructions.

According to an embodiment of the present invention, the first means include for each area of the memory a predetermined number of registers.

According to an embodiment of the present invention, said predetermined number of registers includes index registers for managing the writing and the reading of the other registers of said predetermined number of registers, respectively by the fourth and second means.

The foregoing objects, features and advantages of the present invention will be discussed in detail in the following non-limiting description of specific embodiments in connection with the accompanying drawings.

DETAILED DESCRIPTION

Figure 1:
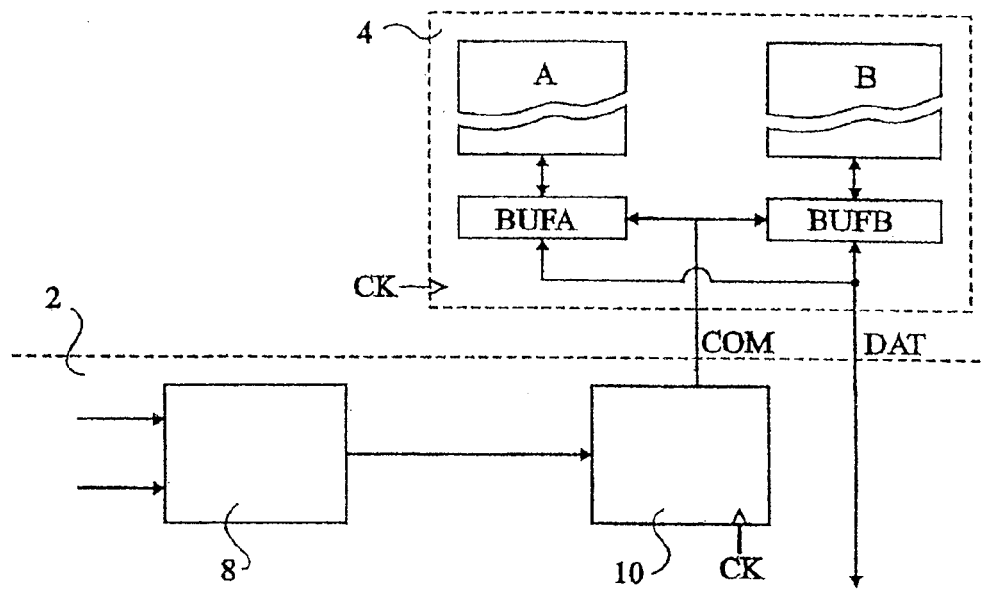
FIG. 1, previously described, schematically shows a conventional DRAM control circuit.
Figure 2:
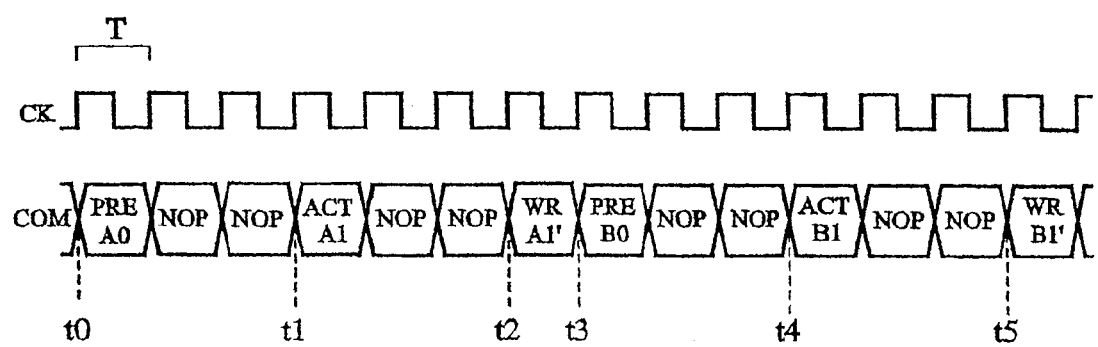
FIG. 2, previously described, illustrates the operation of the control circuit of FIG. 1.
Figure 3:
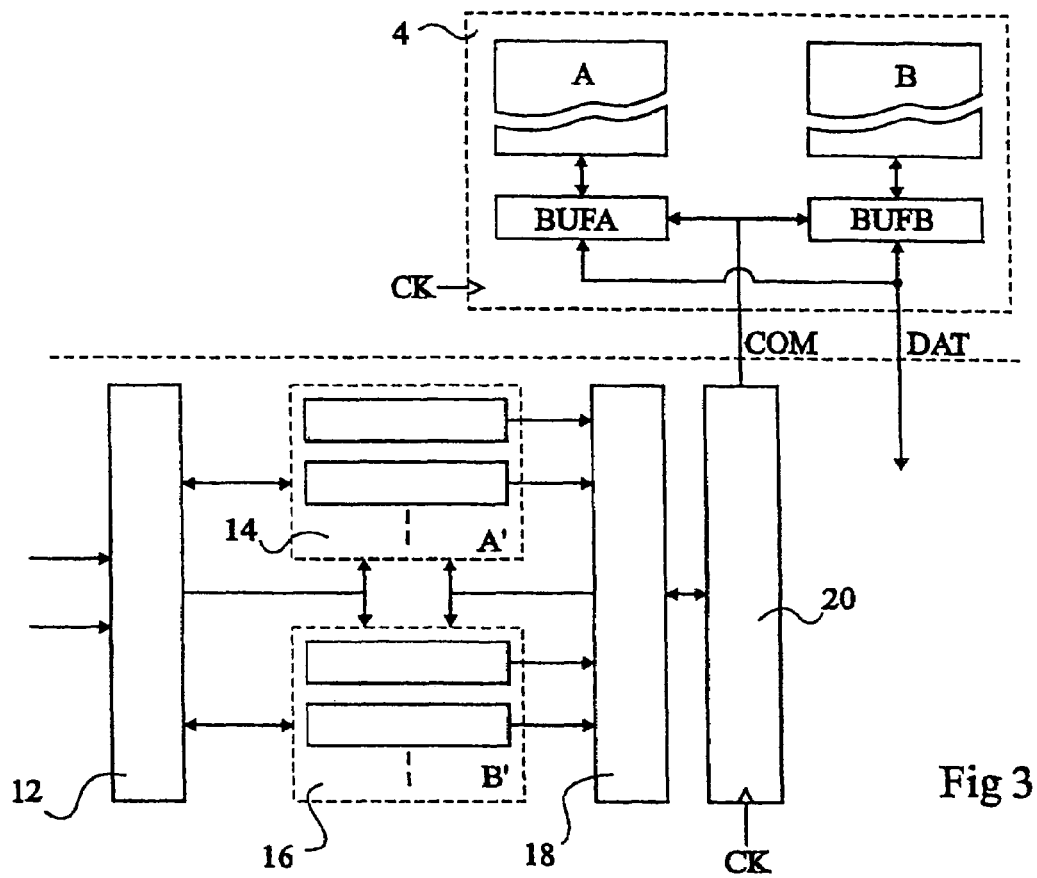
FIG. 3 schematically shows a control circuit according to the present invention.

FIG. 3 schematically shows a memory control circuit according to the present invention, connected to a memory 4. According to the present invention, the control circuit includes a recognition block 12 connected to receive write and/or read requests from blocks (not shown) of the circuit that are connected to bus DAT to exchange data with memory 4. The control circuit further includes two sets of registers 14 (A') and 16 (B') provided for storing the data provided by block 12. A decision block 18 is connected to the outputs of the sets of registers 14 and 16. The output of block 18 is provided to a state machine 20 connected to control bus COM. State machine 20 is rated by the same clock signal CK as memory 4.

When block 12 receives a request intended for memory area A or B, it translates the request into instructions and data, as will be seen hereafter. These instructions/data are respectively stored in register set 14 or 16 according to whether they are intended for area A or B. If block 12 simultaneously receives two requests from two circuit blocks, it first processes the request from the block holding the highest priority according to a conventional priority management. The instructions stored in sets 14 and 16 are analyzed by block 18 to determine whether an instruction is to be followed by a period during which the cache for which it is intended cannot receive other instructions. If such an instruction exists in one of the register sets, block 18 analyzes the instructions/data stored in the other set of registers to determine whether, during said period, it is possible to provide an instruction from the other set of registers to the other cache. State machine 20 provides a clocking signal to decision block 18 to receive upon each new period of clock signal CK an instruction to be provided to one or the other of the memory caches. If no instruction must be provided, state machine 20 generates an instruction NOP. State machine 20 translates the instructions provided by block 18 into elementary coded instructions accepted by memory 4.

Figure 4:
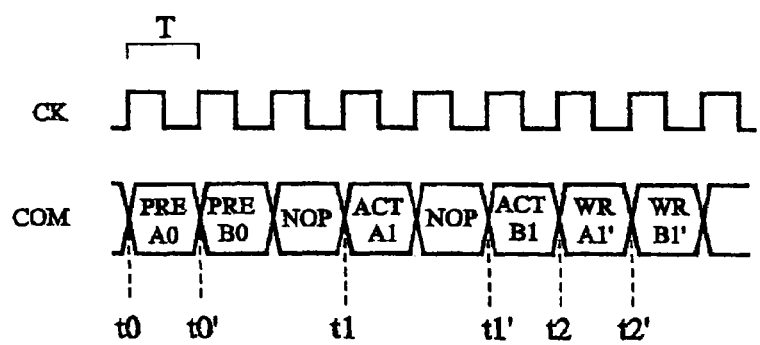
FIG. 4 schematically illustrates the operation of the control circuit of FIG. 3.

FIG. 4 schematically illustrates two series of instructions provided at the rate of clock signal CK by state machine 20. As previously, the two series of instructions respectively correspond to a first request for writing a word at an address A1' in a page A1 of memory area A, and to a second request for writing a word at an address B1' in a page B1 of memory area B. As previously, each request starts with a page preload instruction, followed by a page activation instruction and a word write instruction.

Preload, activation, and write instructions PRE AO, ACT A1, and WR A1' intended for memory area A are, as previously, provided with an interval of three periods T at times t0, t1, and t2, respectively. However, according to the present invention, preload instruction PRE B0 intended for memory area B is provided to bus COM at a time t0' occurring one period T after time t0. Time t0' is the beginning of the period following instruction PRE A0 during which cache BUFA can receive no other instruction. Similarly, activation instruction ACT B1 intended for memory area B is provided to bus COM at a time t1' occurring two periods T after time t1. It should be noted that one instruction NOP is thus interposed between instructions ACT A1 and ACT B1. Such an interposed instruction NOP is necessary for most memories, which cannot, by construction, successively receive two instructions ACT. However, in the case of a memory that can successively receive two instructions ACT, time t1' could occur one period T after time t1. Finally, write instruction WR B1' intended for memory area B is provided at a time t2' occurring one period T after time t2. It should be noted that the writing of word A1 occurs before the writing of word B1, that is, respecting the priority order with which the write requests have been provided to register sets 14 and 16.

In the example shown, the present invention enables providing memory 4 with two write requests within eight periods of clock signal CK. This number should be compared with the fourteen clock signal periods which are necessary according to prior art to provide the same requests to the same memory. This speed gain can be generalized to the other write/read requests, not shown, which can be provided to the memory. The present invention enables obtaining a high data rate without using a faster clock signal than according to prior art. Thus, it is possible, with a memory control circuit according to the present invention, to have a higher data rate than with a control circuit according to prior art, while using a clock signal of lower frequency than according to prior art. Further, since a control circuit according to the present invention enables high data rate with a memory operating at a low frequency, the present invention allows use of an inexpensive memory.

The present invention is also adapted to memory control circuit performing burst write and read operations. When a memory performs on a first cache a burst sequence of write or read operations, said cache can receive no other instruction and control bus COM is free to provide instructions to the second cache. However, data bus DAT is used by the write or read operations. Block 18 is thus provided for, during a burst write/read operation in a cache, only providing the other cache with instructions that do not result in a use of data bus DAT (such as the previously-described preload and activation operations).

Figure 5:
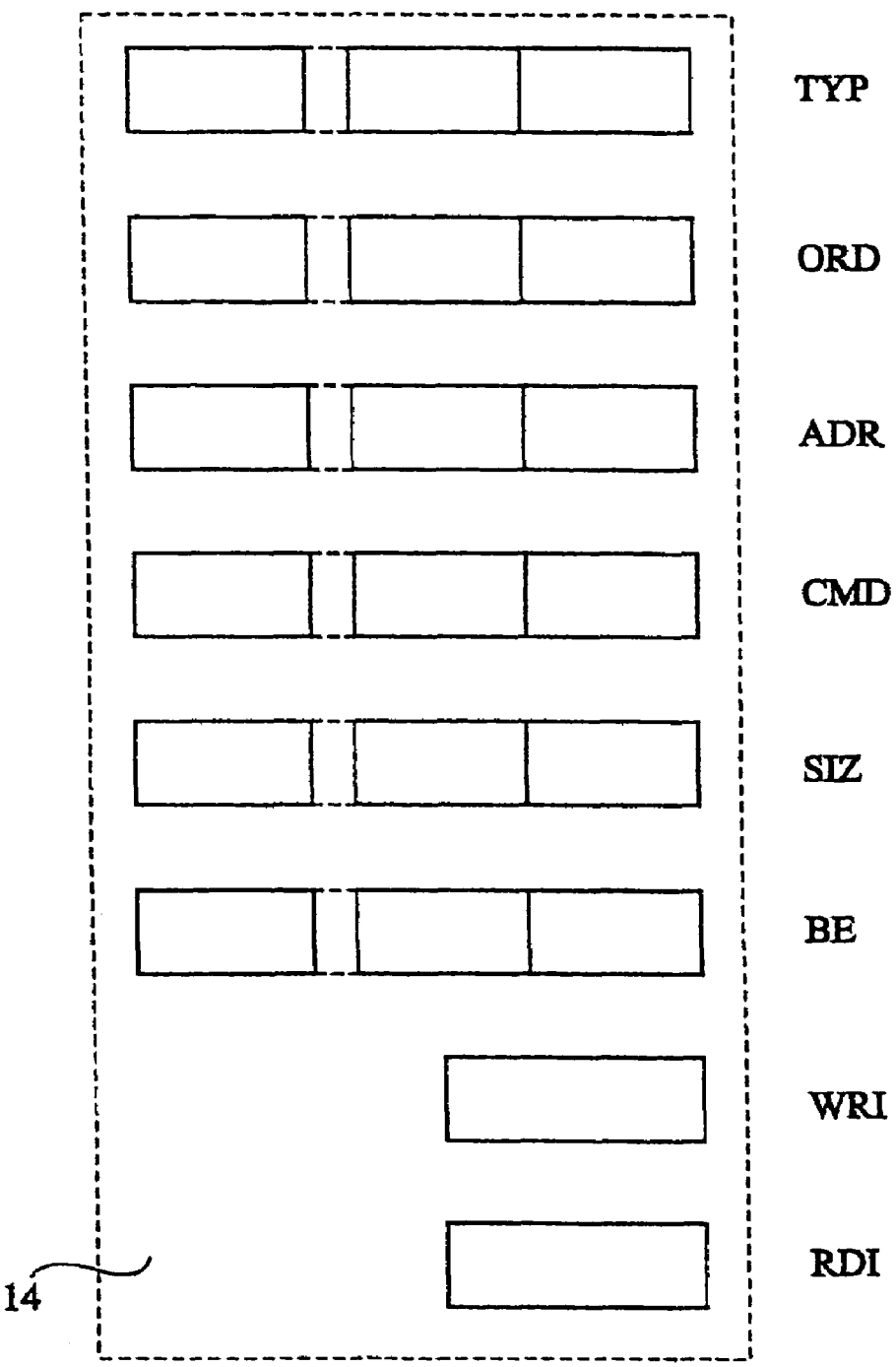
FIG. 5 schematically shows the structure of a set of registers of the control circuit according to the present invention.

FIG. 5 schematically shows register set 14. Register set 16 has an identical structure. Register set 14 includes a type register (TYP), an order register (ORD), an address register (ADR), a control register (CMD), a size register (SIZ), a byte enable register (BE), a write index register (WRI), and a read index register (RDI). The write index register contains an address updated by block 12. The read index register contains an address updated by block 18. The type, order, address, control, size, and byte enable registers are of FIFO type and they each contain an equal number of data, each locatable by an address. The FIFO registers are connected to be written into by block 12 at the address contained in the write index register and read from by block 18 at the address contained in the read index register. It should be noted that a comparison of the addresses included in the write and read index registers enables knowing the filling rate of the FIFO registers. If all the addresses of the FIFO registers are used, it is no longer possible to store the data concerning a request in the register set, and an error message is generated.

Each request received by block 12 causes the writing of data into the FIFO registers, and an incrementation of the address of the write index register.

The type register receives a datum indicating whether the request is a read or write request.

The order request receives an absolute time indicating the time at which the request has been provided to the control circuit. This time indication enables circuit 18 to select which instruction is to be sent first.

The address register receives the page and word addresses at which the request must be executed.

The control register contains the instructions necessary to execute the request. For example, instructions PRE, ACT, WR for a request for writing into a new page, and instructions WR for a request for writing into an already activated page. The instructions necessary to execute the request are especially determined according to the address of the page for which the request is intended, which is compared to the address of the page for which the preceding request is intended. To achieve this, block 12 can read from the control register, by a connection not shown.

The size register receives the number of periods necessary to execute the request.

The byte enable register receives the number of data bytes involved in each request (for example when not all the bytes of a word must be written or read).

To ensure a fast general operation of block 18, said block is provided for, when the data concerning a request are particularly simple and fast to process, starting. processing the next request. The number of data that can be stored in the set of FIFO registers determines the number of requests that block 18 can analyze in advance.

Of course, the present invention is likely to have various alterations, modifications, and improvements which will readily occur to those skilled in the art upon reading the foregoing description. In particular, a control circuit in which a write request is executed in a specific way has been described, but those skilled in the art will easily adapt the present invention to a control circuit in which a same request is executed differently. For example, a write request can correspond to an activation instruction followed by a write instruction and by a preload instruction.

Further, the present invention has been described in relation with a memory including two memory areas, but those skilled in the art will easily adapt the present invention to a memory including a greater number of memory areas. The control circuit according to the present invention will then include as many register sets as the memory will have memory areas.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for controlling a memory, the memory having at least two areas which cannot be accessed simultaneously, the circuit comprising:
   a first means for storing a series of read and/or write instructions separately for each of said areas;
   a second means connected to said first means and arranged to receive and analyze the instructions stored by said first means, and to detect that a first instruction intended for a first area of the at least two areas is a predetermined instruction to be followed by a period during which the first area of the at least two areas can receive no other instruction, and;

a third means for providing instructions to another area during said period.

2. The circuit of claim 1, wherein each of the areas is accessible via a specific cache.

3. The circuit of claim 1, further comprising a fourth means for receiving read and/or write requests and for writing each of said requests in the form of a series of instructions into the first means, each series of instructions including a predetermined number of data.

4. The circuit of claim 3, wherein said predetermined number of data of a series of instructions includes an indication of the priority order existing between each series of instructions stored in the first means.

5. The circuit of claim 4, wherein the first means comprises, for each area of the memory, a predetermined number of registers.

6. The circuit of claim 5, wherein said predetermined number of registers comprises index registers for managing the writing and the reading of the other registers of said predetermined number of registers, respectively by the fourth and second means.

7. The circuit of claim 3, wherein said predetermined number of data of a series of instructions includes an indication of whether the series of instructions enables a reading from or a writing to the memory.

8. The circuit of claim 7, wherein the first means comprises, for each area of the memory, a predetermined number of registers.

9. The circuit of claim 8, wherein said predetermined number of registers comprises index registers for managing the writing and the reading of the other registers of said predetermined number of registers, respectively by the fourth and second means.

10. The circuit of claim 3, wherein said predetermined number of data of a series of instructions includes the addresses for which said series of instructions is intended.

11. The circuit of claim 10, wherein the first means comprises, for each area of the memory, a predetermined number of registers.

12. The circuit of claim 11, wherein said predetermined number of registers comprises index registers for managing the writing and the reading of the other registers of said predetermined number of registers, respectively by the fourth and second means.

13. The circuit of claim 3, wherein said predetermined number of data of a series of instructions includes a plurality of instructions forming said series of instructions.

14. The circuit of claim 13, wherein the first means comprises, for each area of the memory, a predetermined number of registers.

15. The circuit of claim 14, wherein said predetermined number of registers comprises index registers for managing the writing and the reading of the other registers of said predetermined number of registers, respectively by the fourth and second means.

16. The circuit of claim 3, wherein said predetermined number of data of a series of instructions includes a necessary duration to execute said series of instructions.

17. The circuit of claim 16, wherein the first means comprises, for each area of the memory, a predetermined number of registers.

18. The circuit of claim 17, wherein said predetermined number of registers comprises index registers for managing the writing and the reading of the other registers of said predetermined number of registers, respectively by the fourth and second means.

19. An apparatus for controlling a memory, the memory having at least a first area and a second area which cannot be accessed simultaneously, the apparatus comprising:
a first register set to store at least one first instruction relating to reading data from and/or writing data to the first area, the at least one first instruction including first size information relating to a first number of successive clock periods required for the at least one first instruction;
a second register set to store at least one second instruction relating to reading data from and/or writing data to the second area, the at least one second instruction including second size information relating to a second number of the successive clock periods required for the at least one second instruction;
a state machine to translate the at least one first instruction and the at least one second instruction to an elementary code for the memory, the state machine providing the elementary code corresponding to the at least one first instruction and the at least one second instruction to the memory during a third number of the successive clock periods; and
a decision circuit, coupled to the at least one first register set, the at least one second register set, and the state machine, to analyze at least the first size information to determine the third number of the successive clock periods such that the third number is less than a sum of the first number and the second number.

* * * * *

UNITED STATES PATENT AND TRADEMARK OFFICE
CERTIFICATE OF CORRECTION

PATENT NO. : 7,395,399 B2
APPLICATION NO. : 11/446553
DATED : July 1, 2008
INVENTOR(S) : Pierre Marty et al.

Page 1 of 1

It is certified that error appears in the above-identified patent and that said Letters Patent is hereby corrected as shown below:

On the title page, item (75) should read:
(Inventors) Inventors: Pierre Marty, Seyssins, (FR), Gaëlle Rey, Grenoble, (FR), Pascal Chauvet, Grenoble, (FR)

Col. 4, line 61 should read:
Preload, activation, and write instructions PRE A0, ACT Claim 19, col. 8, line 38 should read:
elementary code corresponding to the at least one first Signed and Sealed this Nineteenth Day of August, 2008

JON W. DUDAS
*Director of the United States Patent and Trademark Office*